United States Patent [19]

Temple

[11] Patent Number: 4,908,687
[45] Date of Patent: Mar. 13, 1990

[54] CONTROLLED TURN-ON THYRISTOR

[75] Inventor: Victor A. K. Temple, Clifton Park, N.Y.

[73] Assignee: General Electric Company, Schenectady, N.Y.

[21] Appl. No.: 306,251

[22] Filed: Feb. 2, 1989

Related U.S. Application Data

[63] Continuation of Ser. No. 119,283, Oct. 30, 1987, abandoned, which is a continuation of Ser. No. 857,201, Apr. 29, 1986, abandoned, which is a continuation of Ser. No. 626,165, Jun. 29, 1984, abandoned.

[51] Int. Cl.$^4$ .............................................. H01L 29/74
[52] U.S. Cl. ......................................... 357/38; 357/51; 357/55; 357/64; 357/86
[58] Field of Search ....................... 357/38, 51, 64, 56, 357/55, 86

[56] References Cited

U.S. PATENT DOCUMENTS

| | | |
|---|---|---|
| 3,246,172 | 4/1966 | Sanford . |
| 3,248,677 | 4/1966 | Hunter et al. . |
| 3,408,545 | 10/1968 | De Cecco et al. . |
| 4,012,761 | 3/1977 | Ferro et al. ............... 357/38 |
| 4,261,001 | 4/1981 | Temple ...................... 357/38 |
| 4,281,336 | 7/1981 | Sommer et al. . |
| 4,314,266 | 2/1982 | Temple ...................... 357/38 |
| 4,500,901 | 2/1985 | Sommer et al. . |

*Primary Examiner*—Joseph E. Clawson, Jr.
*Attorney, Agent, or Firm*—Robert Ochis; James C. Davis, Jr.; Marvin Snyder

[57] ABSTRACT

A multistage amplifying thyristor incorporates integral current control resistor regions between adjacent thyristor stages for limiting turn-on current in all but the main thyristor stage. The thyristor is essentially immune from di/dt turn-on failure without the need for external circuitry to limit di/dt in the thyristor. Modulation of the current control resistor region during turn-on is prevented by adequately spacing or shielding the region from the emitter of each thyristor stage as well as by adequate spacing or shielding of the resistor region from a portion of the lowermost emitter region containing a turn-on plasma of the preceding thyristor stage.

22 Claims, 5 Drawing Sheets

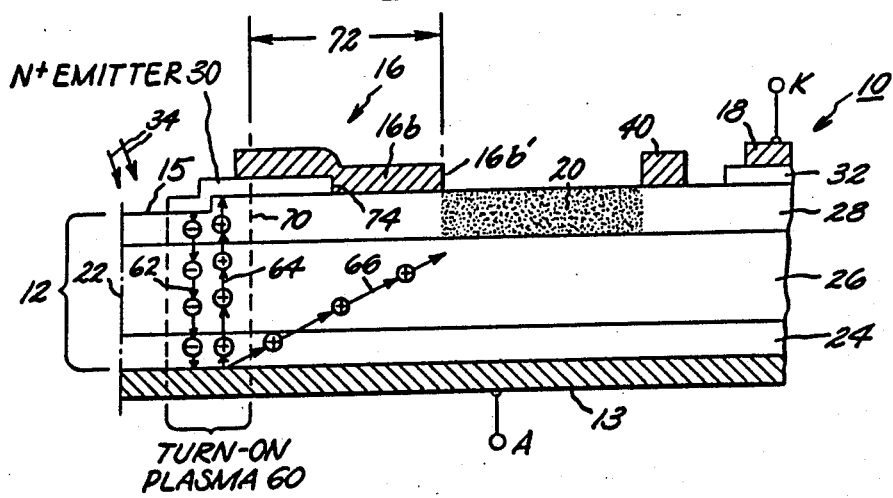
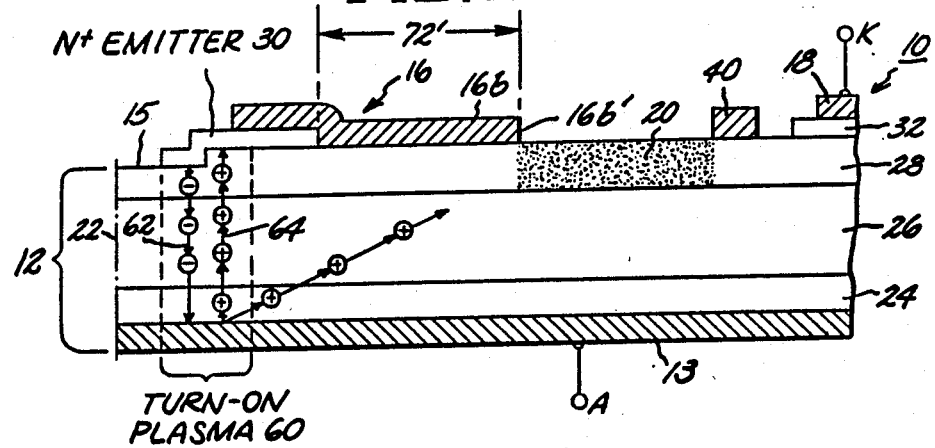
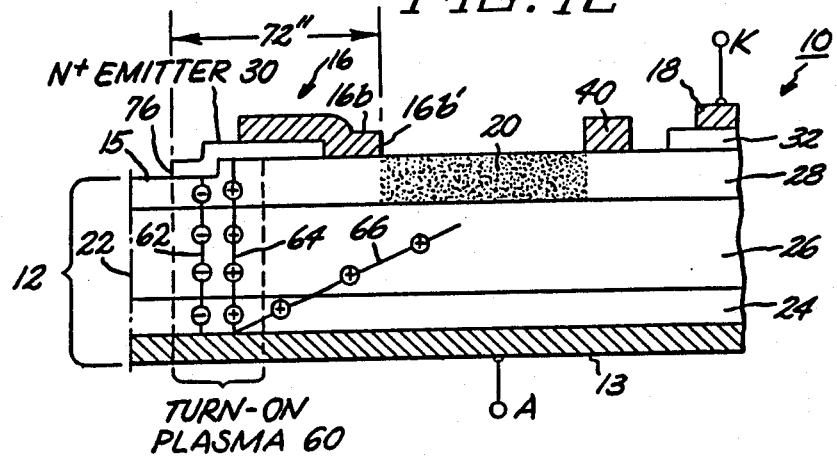

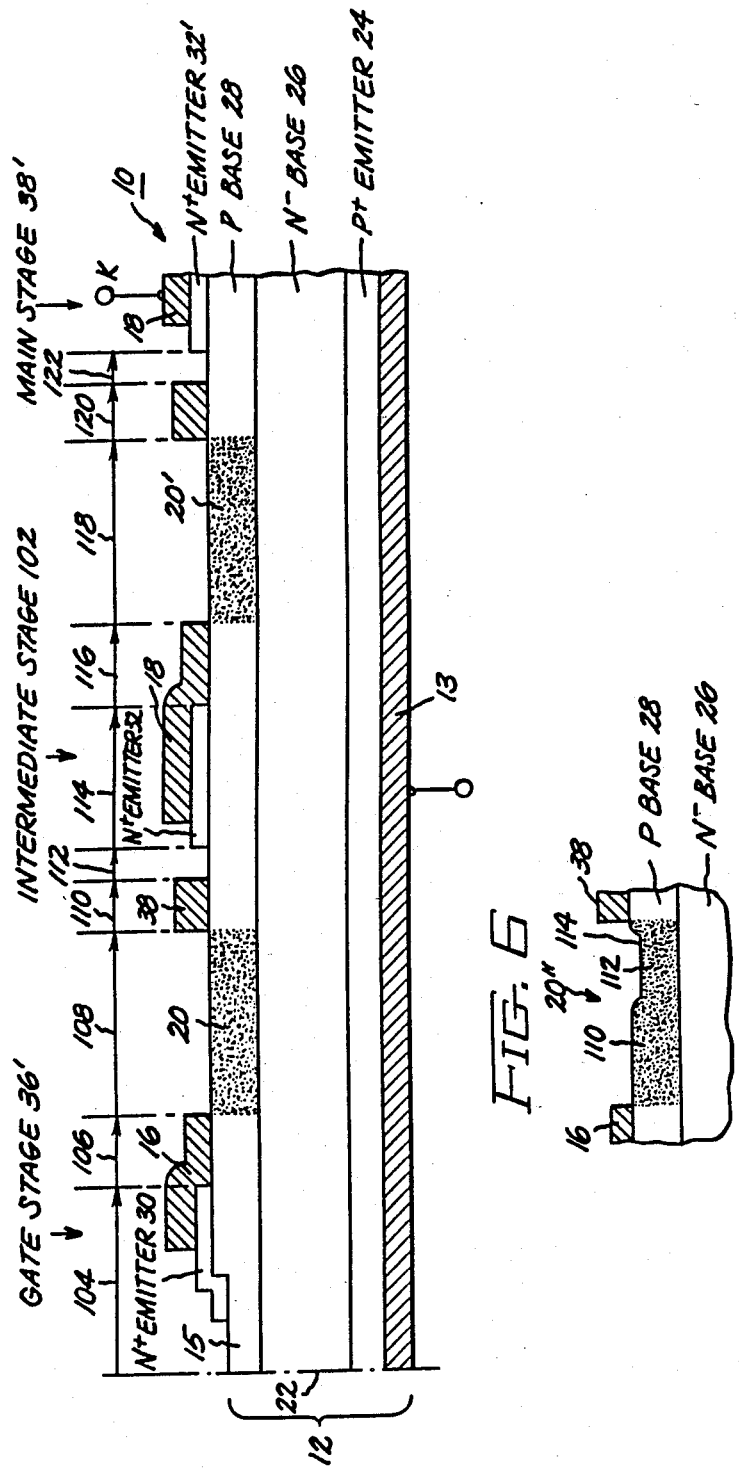

CONTROLLED TURN-ON THYRISTOR

This application is a continuation application of Ser. No. 119,283, filed Oct. 30, 1987, as a continuation of application Ser. No. 857,201, filed Apr. 29, 1986 as a continuation of application Ser. No. 626,165, filed June 29, 1984, all abandoned.

BACKGROUND OF THE INVENTION

The present invention relates to multistage amplifying thyristors with gate and main stages and, more particularly, relates to a multistage amplifying thyristor in which the peak turn-on current in the gate and any intermediate thyristor stages is limited during thyristor turn-on.

Conventional multistage amplifying thyristors include gate and main stages and may include one or more intermediate stages. The reason for including several stages in a thyristor is to permit turn-on of the thyristor with a gate signal of very low energy. For example, a light triggered thyristor (LTT) must rely upon a minute amount of light energy (typically on the order of about 20 nanojoules) to turn on the thyristor. This is possible since the light energy turns on only a gate thyristor stage which is highly-sensitive but of low current rating and which, in turn, turns on any intermediate thyristor stage. Successive turn-on of the various thyristor stages continues until turn-on of the main thyristor stage is turned on.

A significant limitation of conventional multistage amplifying thyristors is that the rate of turn-on, or di/dt, of such thyristors used in typical circuits must be controlled by external circuit devices in order to prevent thermal stresses in the thyristor from destroying the thyristor. For instance, a typical high voltage direct current tansmission system utilizing thyristors for alternating current-to-direct current conversion incorporates relatively expensive saturable reactors. This type of reactor presents a temporary, high inductive impedance to turn-on current flow in a thyristor, but rapidly falls off in its level of inductive impedance upon steady state thyristor operation.

A published approach to designing a thyristor with enhanced immunity from di/dt thermal stress failure, known as the controlled turn-on approach, is to incorporate into a multistage amplifying thyristor current control resistor regions, one between each pair of adjacent thyristor stages. These current control resistor regions are intended to reduce turn-on, or di/dt, thermal stress in a thyristor by functioning to, first, reduce the current in each preceding or prior turned-on thyristor stage and, second, reduce the duty cycle of each preceding thyristor stage. The subject approach is described in detail, for example, in an article by VAK Temple (the present inventor) entitled "Controlled Turn-on Thyristors" published in IEEE Transactions on Electron Devices, Vol. ED-30 (July 1983) at pages 816–824, the entirety of this article being incorporated herein by reference.

The foregoing Temple article describes successful performance of 5 kilovolt thyristors that were tested to a 600 volt level. Subsequent testing of thyristors such as described in the Temple article by the present inventor has shown the occurrence of turn-on failure, due to thermal stresses, at about the 2000 volt level. Further investigation into the controlled turn-on approach described in the Temple article has revealed that certain considerations, not taken into account in the investigation described in the article, are a factor in causing turn-on failure at about the 2000 volt level. The present invention addresses these considerations and results in a multi-stage amplifying thyristor successfully exhibiting controlled turn-on at considerably higher voltages than heretofore attainable.

In general terms, the considerations not addressed in the Temple article are centered around the decrease in resistance value of the current control resistor regions incorporated into a thyristor, due to what is known in the art as a "modulation" effect in such resistor regions. It is important to note that these resistor regions comprise semiconductor material of nominal doping concentration and of either P- or N-conductivity type. The increase in either majority or minority carrier concentration in the current control resistor regions results in modulation, or lowering, of the resistance of such regions. This is readily appreciated in the case of increased majority carrier concentration due to the overall increase in concentration of majority carriers; however, in the case of increased minority carrier concentration, an additional phenomenon known in the art as the principle of quasi-neutrality is involved. In accordance with this principle, the concentration of majority carriers in a semiconductor region increases to roughly that of the minority carrier concentration, preventing unduly high electric fields from occurring in the thyristor.

The Temple article points out that within a multistage amplifying thyristor, there are sources of mobile carriers (in particular, the cathode emitter layers of the various thyristor stages) that increase the current carrier level in the current control resistor regions, unless these regions are sufficiently spaced or otherwise shielded from such sources of carriers. The present invention is directed to a thyristor design in which further sources of mobile carriers, not recognized at the time of publication of the Temple article, are spaced or shielded from such sources of mobile carriers by an extent sufficient to minimize modulation of the current control resistor regions.

SUMMARY OF THE INVENTION

Accordingly, it is a principal object of the present invention to provide a multistage amplifying thyristor with a reliable turn-on characteristic.

It is a further object of the invention to provide a multistage amplifying thyristor that is essentially immune from di/dt failure.

It is yet another object of the invention to provide a multistage amplifying thyristor with improved current control resistor regions that may be fabricated using conventional processing techniques.

In carrying out the objects of the invention, a multistage amplifying thyristor is provided, which includes a semiconductor body, a first emitter electrode, inner and outer stage emitter electrodes, and a current control resistor region. The semiconductor body, in preferred form, comprises a P+ emitter layer, an N− base layer atop the P+ emitter layer, a P base layer atop the N− base layer, an inner stage N+ emitter layer atop the P base layer, and an outer stage N+ emitter layer atop the P base layer and which is adjacent to and situated in, what is referred to herein as, an "outward" direction from the inner stage N+ emitter layer.

The first emitter electrode underlies the P+ emitter layer. The inner stage emitter electrode in a first part overlies the inner stage N+ emitter layer and in a second part, situated outwardly from the first part, overlies the P base layer. The outer stage emitter electrode overlies the outer stage emitter layer. The current control resistor region constitutes a portion of the P base layer having its inner side extending as far as an outward edge of the inner stage emitter electrode and having its outward side extending as far as a recombination ring.

The current control resistor region has an unmodulated resistance value selected to limit to a safe level the turn-on current in each preceding thyristor stage. To minimize modulation of the current control resistor region during turn-on of the thyristor, an outer edge of the inner stage emitter electrode extends outwardly by a predetermined distance of at least about the greater of one thickness of the semiconductor body and two ambipolar diffusion lengths in the N− base layer from any of:

an inner edge of the first stage emitter layer,
an outer edge of a turn-on plasma beneath the inner stage N+ emitter layer, and
an outer edge of the first stage N+ emitter layer.

Utilizing the above-described spacing of the current control resistor region from the first stage N+ emitter layer, hole carrier injection from a portion of P+ emitter layer situated beneath the first stage emitter layer is prevented from modulating the current control resistor region.

BRIEF DESCRIPTION OF THE DRAWINGS

The features of the invention deemed to be novel are defined in the appended claims. The invention itself, however, both as to organization and method of operation, together with further objects and advantages thereof may be best understood with reference to the following description when read in conjunction with the accompanying drawings, in which:

FIGS. 4A–4C depict variations of the thyristor of FIG. 1 and illustrate different arrangements for spacing a current control resistor region from a first stage N+ emitter layer of the thyristor, which spacing minimizes modulation of the current control resistor region;

FIG. 5 depicts a further thyristor of the present invention incorporating an intermediate or pilot stage and indicates exemplary dimensions of various parts of the thyristor;

FIG. 6 is a fragmentary view of a current control resistor region that may be used in the FIG. 1 thyristor, illustrating, in particular, a multi-zoned current control resistor region for equalizing thermal stresses in the various zones of the region;

FIGS. 8(a)–(e) illustrate various structures and an equivalent circuit in a three stage thyristor.

DETAILED DESCRIPTION OF THE PREFERRED EMBODIMENTS

Figure 1:
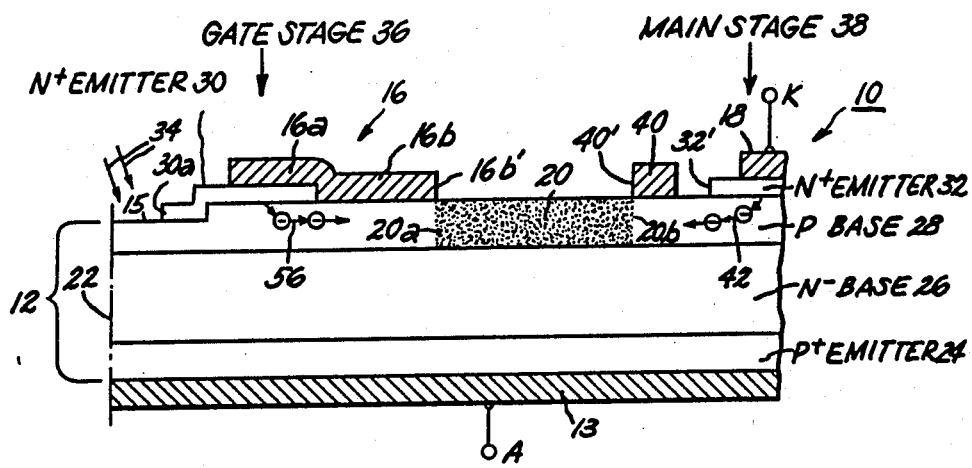
FIG. 1 is a cross-sectional view of a portion of a thyristor incorporating features of the present invention.

Depicted in FIG. 1 is a multistage amplifying thyristor 10 incorporating features of the present invention. Thyristor 10 includes a semiconductor body 12, such as silicon, a first emitter electrode 13, inner and outer stage emitter electrodes 16 and 18, respectively, and a current control resistor region 20. As viewed from above in FIG. 1, thyristor 10 is circular in shape, by way of example, with a center illustrated in FIG. 1 as center line 22. Inner and outer stage emitter electrodes 16 and 18, respectively, appear, as viewed from above in FIG. 1, as annular in shape.

Semiconductor body 12 includes a P+ emitter layer 24, N− base layer 26 atop emitter layer 24, P base layer 28 atop base layer 26, an N+ emitter layer 30 atop base layer 28, and an N+ emitter layer 32 atop base layer 28 and which is adjacent to and situated in an outward direction from emitter layer 30, an "outward" direction signifying herein radially outward from center line 22. Depression 15 in P base layer 28, into which an inner edge 30a of N+ emitter layer 30 extends, constitutes a gate area onto which radiation, such as light radiation 38, impinges for initiating turn-on of thyristor 10. N+ emitter layer 30 constitutes the emitter of an inner thyristor stage 36, comprising a gate thyristor stage, while emitter layer 32 constitutes the emitter of an outer thyristor stage 38, that may comprise an intermediate or a main thyristor stage.

First emitter electrode 13 underlies P+ emitter layer 24 and is designated "A", for "anode". Inner stage emitter electrode 16 in a first part 16a overlies emitter layer 30 and in a second part 16b, situated outwardly from first part 16a, overlies P base layer 28. Main stage emitter electrode 18 overlies N+ emitter layer 32 and is designated "K" for "cathode". The foregoing electrodes 13, 16 and 18 preferably comprise aluminum.

Further included in thyristor 10 is a recombination ring 40, such as aluminum, the purposes of which are elaborated on below.

Current control resistor region 20 constitutes a portion of P base layer 28 having its inner side 20a extending as far as an outward edge 16b of inner stage emitter electrode 16 and having its outward edge 20b extending as far as an inner edge 40' of recombination ring 40.

Current control resistor region 20 has an unmoduated resistance between inner and outer sides 20a and 20b that is selected to limit to a safe level the turn-on current in the preceding, or gate stage 36, of thyristor 10. Selection of an appropriate value for the unmodulated resistance of resistor region 20 is discussed in the above-referenced Temple article. A portion of that discussion is incorporated below beginning with "Controlled (Normal) Turn-On Resistors". Fabrication of resistor region 20 is suitably accomplished by providing a suitable spacing between inner and outer resistor sides 20a and 20b without there being a need to specially alter the doping level (and, hence, resistivity) of P base layer 28. Alternatively, the doping concentration of resistor region 20 can be specially adjusted by ion implantation of suitable dopant, for example, whereby the separation between resistor sides 20a and 20b can be controlled independently of the doping level of the remainder of P base layer 28.

Figure 2:
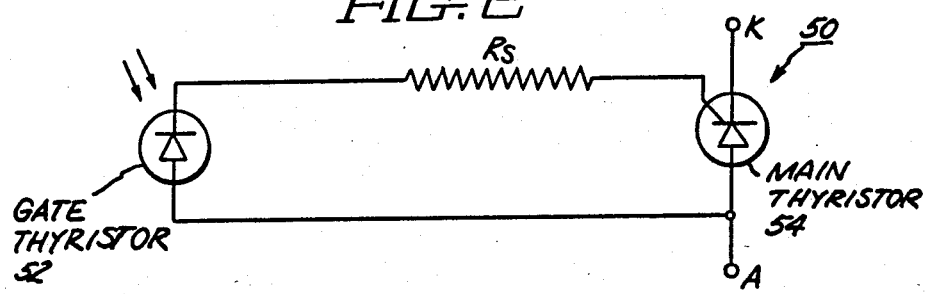
FIG. 2 is a schematic electrical circuit equivalent of the thyristor of FIG. 1.

The purposes of current control resistor region 20 can be better understood with reference to the FIG. 2 illustration of electrical circuit 50, which is the circuit equivalent of thyristor 10 of FIG. 1. Gate and main thyristors 52 and 54, respectively, of electrical circuit 50 correspond to the gate and main stages 36 and 38, respectively, of thyristor 10, while the interstage series resistance $R_s$ between thyristors 52 and 54 corresponds to the net device resistance between inner and outer stage emitter electrodes 16 and 18, respectively, of thyristor 10.

Interstage resistance $R_s$ in circuit 50 provides two protective features in circuit 50: first, it limits current flow in gate thyristor 52 while main thyristor 54 is turned on, and, second, it reduces the duration of time that gate thyristor 52 conducts current when thyristor 10 is turning on, since current through main thyristor 54, once this thyristor is turned on and thus in a low impedance state, is favored over current through gate thyristor 52, which must flow through interstage resistance $R_s$.

Interstage resistance $R_s$ contains components that are modulated during turn-on of circuit 50 (corresponding to turn-on of thyristor 10) to reduce the resistance value of $R_s$ during this period of time. It is preferred that the modulated component of $R_s$ not exceed about 10 percent of the unmodulated $R_s$ value, although modulation as high as about 20 percent is believed to be acceptable.

The modulated components of resistance $R_s$ can be understood by considering the analogous structure of thyristor 10 corresponding to resistance $R_s$ of circuit 50. The thyristor 10 equivalent of resistance $R_s$ constitutes the net resistance between inner and outer stage emitter electrodes 16 and 18 as measured with emitter electrodes 16 and 18 free-floating in potential. Such net resistance contains modulated components during turn-on of thyristor 10 which are due, for example, to injection into P base layer 28 from N+ emitter layer 30 of electrons depicted by path 56 and injection into P base layer 28 of electrons depicted by path 42 from N+ emitter layer 32. To prevent electrons in path 42 from reaching resistor region 20 and modulating such region, recombination ring 40 removes electrons 42 in path from P base layer 28 in its function as a carrier recombination region. Even with recombination ring 40 present, spacing of inner edge 40' of recombination ring 40 from inner edge 32' of N+ emitter layer 32 by at least about two minority carrier diffusion lengths in P base layer 28 is desirable.

Recombination ring 40 is also desirable for homogenizing the current transferred from gate stage 36 to main stage 38 of thyristor 10 during device turn-on. Ring 40, however, may be delected from thyristor 10 as long as adequate spacing is provided between N+ emitter layer 32 and current control resistor region 20, spacing of about three minority carrier diffusion lengths in P base layer 28 being suitable, by way of example.

The above-referenced Temple article points out that modulation of a current control resistor region may occur as a rsult of carrier injection from gate and main stage emitter layers into a P base layer (see the Temple article at page 823, FIG. 12(c) and discussion thereof which is included herein below at "Preventing Resistor Modulation During Turn-on". FIG. 12 of the Temple article is included herein as FIG. 8). The Temple article indicates successful attainment of the objective of safe turn-on of a thyristor, but this was verified only at the 600 volt level for a 5 kilovolt device (see the Temple article page 819, seventh paragraph). Further thyristor testing and development has shown that modulation in current control resistor region 20 from a source of carriers other than N+ emitter layers 30 and 32 must be taken into account.

Figure 3:
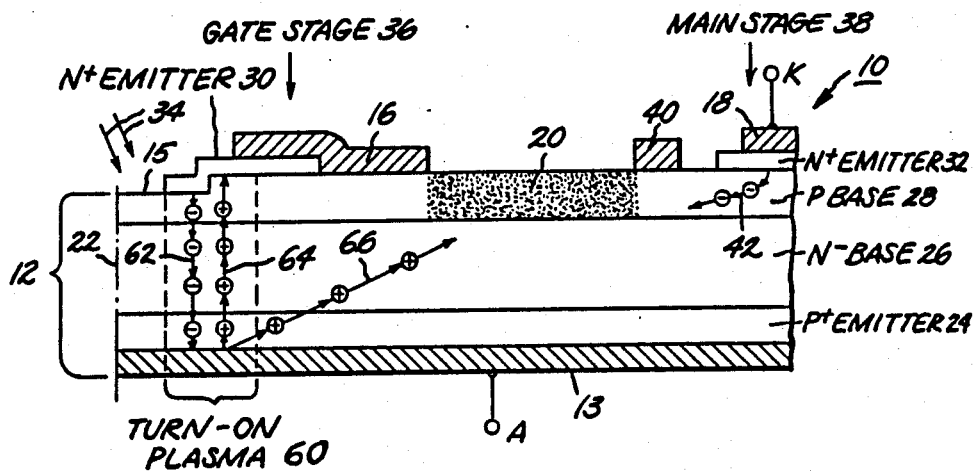
FIG. 3 depicts the thyristor of FIG. 1 and illustrates a source of mobile carriers that may result in unwanted modulation.
Figure 1:
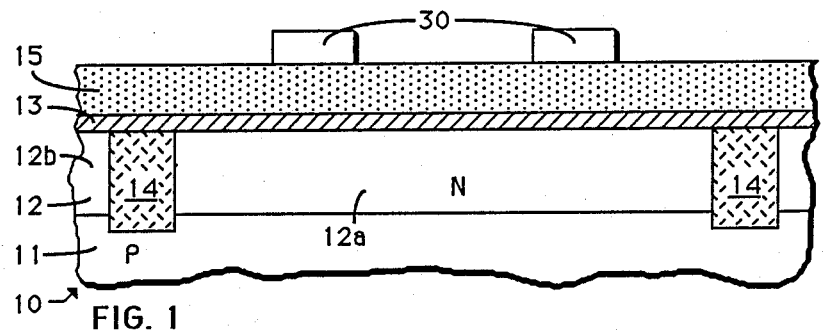
Figure 2:
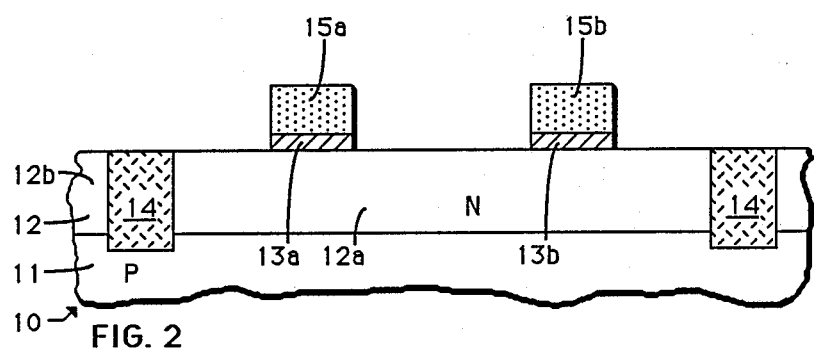
Figure 3:
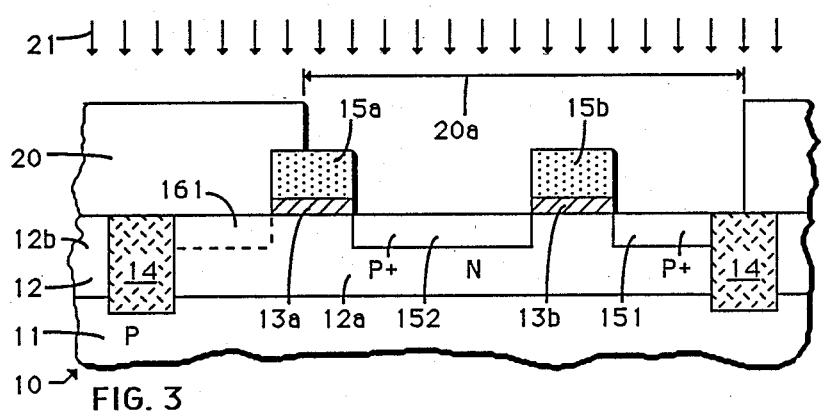

An additional source of carriers that may result in modulation of current control resistor region 20 is illustrated in FIG. 3, depicting the same view of thyristor 10 as shown in FIG. 1, and, further, schematically illustrating a turn-on plasma 60 beneath N+ emitter layer 30. Plasma 60 comprises electrons in path 62 injected from N+ emitter layer 30 into P+ emitter layer 24 and the returning holes in path 64 injected from P+ emitter layer 24. The concentration of holes and electrons in plasma 60 is typically about $10^{17}$ per cubic centimeter for each type of current carrier. Functionally, plasma 60 is the portion of gate stage 36 that turns on when turn-on radiation 34, such as light, impinges upon gate depression 15 so as to generate hole-electron pair turn-on current. Some portion of hole current 66 from turn-on plasma 60 does not remain confined to the high density plasma, but instead becomes attracted to the current control resistor region 20. This attraction occurs because main stage emitter electrode 18 is typically biased to several thousand volts prior to turn-on of main stage 38, while, once gate 36 has turned on, inner stage emitter electrode 16 falls off in voltage magnitude due to its low impedance connection, via turn-on plasma 60, to emitter electrode 13.

To counteract the tendency of holes in path 66 from entering and thus modulating current control resistor region 20, adequate spacing between turn-on plasma 60 and the current control resistor region is provided as depicted in FIG. 4A, illustrating the same view as FIG. 1. In particular, modulation of region 20 by holes in path 66 is avoided if outer edge 16b' of first stage emitter electrode 16 is spaced from an outer edge 70 of turn-on plasma 60 by a predetermined distance 72 of at least about the greater of one thickness of semiconductor body 12 and two ambipolar diffusion lengths (a standard design parameter) in N− base layer 26. More conservative values for predetermined distance 72 are at least the greater of any of: two thicknesses of semiconductor body 12 and two ambipolar diffusion lengths in N− base layer 26; two body thicknesses and three ambipolar diffusion lengths in layer 26; three body thicknesses and two ambipolar diffusion lengths in layer 26; and three body thicknesses and three ambipolar diffusion lengths in layer 26. The location of outer edge 74 of turn-on plasma 60 may be readily determined according to known principles in the art. An alternative spacing arrangement, shown in FIG. 4B, is to space inner stage emitter electrode outer edge 16b' from an outer edge 74 of N+ emitter layer 30 by a predetermined distance 72', which is of equal measure to predetermined distance 72 (indicated in FIG. 4A). A further alternative spacing arrangement, shown in FIG. 4C, is to space first stage emitter electrode outer edge 16b' from inner edge 76 of N+ emitter layer 30 by a predetermined distance of 72", which is of equal measure to predetermined distance 72 (indicated in FIG. 4A). In selecting one of the spacing arrangements of FIGS. 4A–4C, kit it is a general consideration that the longer part 16b (of inner stage emitter electrode 16) is, the less likely it is for resistor region 20 to be undesirably modulated.

By way of example and not limitaton, a 4.5 kilovolt light triggered thyristor 100, shown in FIG. 5, was constructed in accordance with the present invention. Thyristor 100 includes an intermediate stage 102, corresponding to main stage 38 of thyristor 10 (FIG. 1). Light triggered thyristor 100 exhibited safe turn-on at the 4 kilovolt level with a di/dt value of about 450 amps per microsecond and with heat sink temperatures on different testing runs from 38° to 90° Centigrade. The tested thyristor had the following dimensions: radial distance 104 of 25 mils (0.025 inch); radial distance 106

(which includes distance 104) of 65 mils; and radial distances 108, 110, 112, 114, 116, 118, 120 and 122 of, respectively, 120 mils, 130 mils, 140 mils, 165 mils, 190 mils, 275 mils and 288 mils. The approximate resistance of current control resistor region 20 and 20' was, respectively, 98 ohms and 50 ohms.

CONTROLLED (NORMAL) TURN-ON RESISTORS

Figure 7:
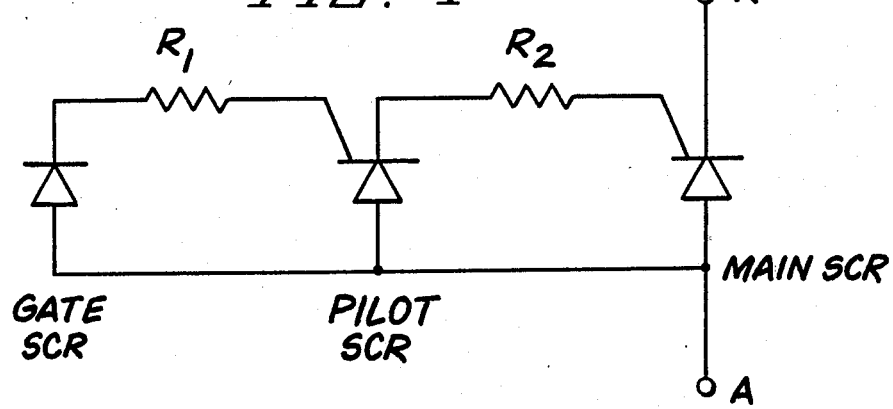
FIG. 7 illustrates an equivalent circuit for the thyristor of FIG. 5.

The best method of resistor selection for normal turn on is to design for equal thermal stresses. Using FIGS. 5 and 7 as an example, the $\Delta T$ for the turn-on lines of the gate, pilot, and main thyristors as well as the $\Delta T$ of resistors R1 and R2 should be equalized for turn-on at maximum voltage. The resistors $R_1$ and $R_2$ in FIG. 7 correspond to the current control resistance regions 20 and 20' in FIG. 5. For accurate calculations one must know the stray and snubber capacitances and the circuit inductance. Device parameters needed are (1) delay times of each stage (which we prefer to know in terms of a threshold gate charge), (2) voltage fall time of each stage as a function of the stage's anode-cathode voltage at the time of turn-on and (3) the on-state voltage level, usually referred to as the modulation voltage, of each stage immediately following its fall time. With these time parameters and a knowledge of the turn-on conduction areas one can calculate the turn-on line $\Delta T$ values and, following that, the resistor $\Delta T$ values. Since we often cannot identify the above turn-on parameters to a high accuracy we usually have to resort to worst case calculations. Resistor $\Delta T$ calculations can be made with more precision. However, once one device has been made and tested all of the variables described above can be identified to about 25 percent and the information reasonably extrapolated to new thyristor device designs at the same voltage level. This subject will be dealt with briefly.

Earlier, resistor modulation during turn-on was referred to as undesirable. This modulation occurs because the gate metal, the lateral p-base region and the n+-emitter layer act as a p-i-n diode with corresponding resistance modulation effects. This subject will also be briefly dealt with in the following.

First it is appropriate to comment on the size of the resistor needed to protect the small light fired gate stage. If we assume the turn-on line to be about one half the inner periphery of the gate thyristor stage and to extend one p-base diffusion length into it then the silicon volume involved $\gamma_G$, in a 5-kV device is 40 $\pi$ mil (turn on line) times 2.5 mil (diffusion length) time 40 mil (device thickness or $2 \times 10^{-4}$ cc. If it carries its maximum current, defined here as $I_G$, (V/R) for 0.5 $\mu$s and turn-on is from 5000 V the maximum thermal rise in turn-on would be $$\Delta T_{G(max)} = 0.5 \, V_G^2 \Delta t_G / R_G C_h \gamma_G \quad (1)$$

where $\Delta t_G$ is the effective duty cycle, $C_h$ is the specific thermal capacity of silicon, and $V_G$ the voltage at which the device is turned on.

The 0.5 comes from the fact that maximum dissipation in the gate stage occurs when and if its impedance is equal to that of the controlled turn-on resistor through time $\Delta t_G$. Thus if $R_G$ were 500$\Omega$, $\Delta T$ would be about 37° C.

The maximum $\Delta T$ of the controlled turn-on resistor would be up to twice as large $$\Delta T_{R(max)} = V_c^2 \Delta t_G / R_G C_h \gamma_R \quad (2)$$

This could only occur if the impedance of the gate stage dropped in a small fraction of R in a time small compared to $\Delta t_G$.

In the above expressions $R_G$ is the gate stage to cathode impedance for energy sources such as stray capacitance and junction capacitance but should include the snubber resistor if the first two capacitances are noticeably discharged during $\Delta_{tG}$. Clearly if $R_G$ is composed of several separate resistors as it is in our design, then (2) is easily modified as in (3)

$$\Delta T_{i(G)} < \frac{V_G^2}{R_G} \frac{R_i}{R_G} \frac{\Delta t}{C_h \gamma_i} \quad (3)$$

where i labels the specific resistor zone and (G) the turn-on stage.

If, as experimental results showed, the gate stage impedance falls to less than $R_G$ before the pilot stage turns on then the voltage $V_P$ across the device at the time that the pilot stage turns on is determined approximately by $$V_p \leq V_G - I_G R_p \quad (4)$$

Again $R_p$ is the impedance between the pilot stage and the cathode but should also include the snubber resistor if the junction and stray capacitances have been significantly discharged. Again we can compute temperature rises in the pilot thyristor turn-on area and in the various components of $R_p$ as below $$\Delta T_{p(max)} = 0.5 V_p^2 \Delta t_p / R_p C_h \gamma_p \quad (5)$$

and $$\Delta T_{i(P)} = \frac{V_p^2}{R_p} \frac{R_i}{R_p} \frac{\Delta t}{C_h \gamma_i} \quad (6)$$

If the pilot stage impedance falls to less than $R_p$ before the main stage turns on then $V_M$, the voltage at which the main stage turns on, is approximately given by $$V_M = V_S - I_p R_S \quad (7)$$

where $V_S$ is the instantaneous voltage of the partially discharged snubber capacitor and $R_S$ is the snubber resistor and $I_p$ is given below $$I_p \sim V_S / R'_p. \quad (8)$$

Here $R'_p$ includes the snubber resistor. Finally for the main stage turn-on $$T_{M(max)} = \frac{V_M^2 \Delta t}{R_S C_h \gamma_M} \quad (9)$$

If we return to the design of our actual device it can be seen that $R_1$ is heated only by gate stage currents while $R_2$ is heated by both the gate and pilot stage current, i.e., $\Delta T_2 = \Delta T_{2(G)} + \Delta T_{2(p)}$.

PREVENTING RESISTOR MODULATION DURING TURN-ON

Figure 8A:
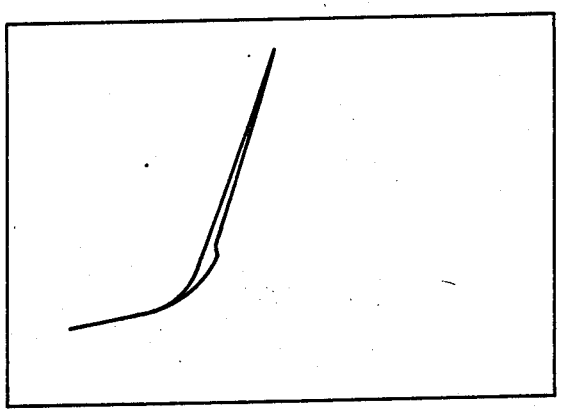
Figure 8B:
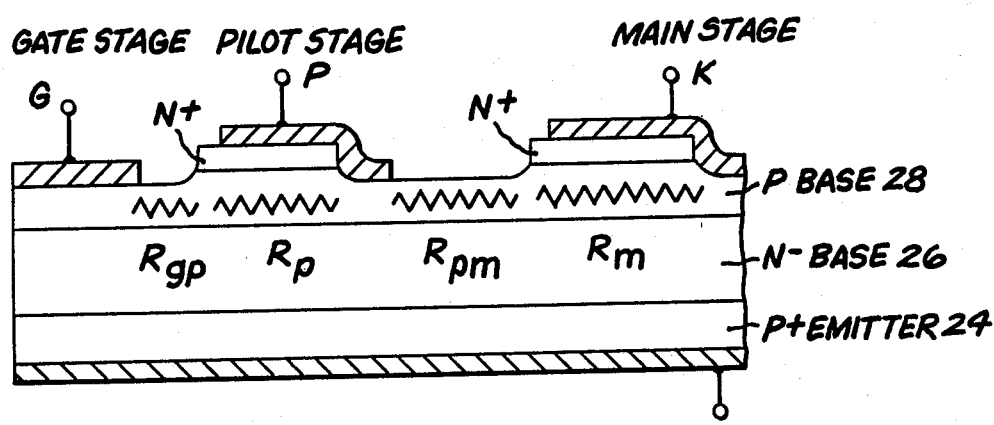

FIG. 8 compares the normal channel of an amplifying gate thyristor with the resistor zone of our controlled turn-on LTT. In FIG. 8(b) the channel ($R_{gp}$ or $R_{pm}$) is typically 10 mil which is about the size of the n-base ambipolar diffusion length and several p-base ambipolar diffusion lengths. Typically the gate metal is aluminum so that one has a moderately good p-i-n diode action along the inter-stage current path from P-K as illustrated in FIGS. 8(c) and (d). For example channel impedance is typically of the order of 10Ω but during turn-on falls to less than a tenth of this value. These values can be quickly identified knowing the device parameters using an open anode gate current trace such as in FIG. 8(a).

In our device we needed to destroy the diode behavior and replace it with a current flow which was largely resistive. Theoretically it would have been sufficient to increase channel width X in FIG. 8(d) by an additional half dozen diffusion lengths to leave a central portion that was more or less unmodulated. This is obviously wasteful since the end regions are still highly modulated. What we found to work reasonably well, in the sense that resistor value dropped only by about 10 percent from a 1 mA to 10 A current flow, was the introduction of an extra metal "recombination ring" as shown in FIG. 8(e) which served to recombine most of the electrons injected from the following emitter stage leaving the resistor zone essentially unmodulated. Recombination zone widths of 5 and 10 mil were suitable, these values being larger than both the p-base thickness and the p-base diffusion length.

If the amperage rating of thyristor 10 (FIG. 1) is very high, it is desirable to construct current control resistor region 20 in such a way as to more evenly spread the thermal stresses radially across the region. A preferred technique for accomplishing this is illustrated in FIG. 6, depicting a fragmentary view of a modified region 20". This region includes first and second zones 110 and 112, respectively, with zone 112 being located outwardly of zone 110 and being thinner, and thus of higher resistance, than zone 110. Zone 112 may be implemented, for example, by an etch step (not illustrated) that removes an upper portion of P base layer 28 down to level 114. This etch step may be advantageously be carried out simultaneously with the etch step for gate depression 15 of gate stage 36 of thyristor 10 (FIG. 1). Zones 110 and 112 dissipate approximately the same amount of heat per unit volume as each other since the higher (current)$^2$×resistance heating of zone 112 is dissipated in a larger volume, zone 112 being of larger volume since it is located radially outward of zone 110.

Although not illustrated, current control resistor zone 20 may also be implemented as a series of zones of increasing resistance with increasing radial spacing. This could be accomplished, for example, by providing a series of successively thinner zones in a current control resistor region extending in the outward direction. As an alternative to utilizing thinner zones for higher resistance, zones of higher resistance could be implemented by ion implantation of suitable dopant, with a high resistance zone having a low dopant concentration, for example.

Fabrication of the above-described thyristors may be carried out with conventional semiconductor device processing techniques and will be within the purview of those skilled in the thyristor art in light of the present specifications.

The foregoing describes a multistage amplifying thyristor incorporating built-in or integrated current control resistor regions between adjacent thyristor stages for limiting current in all but the main thyristor stage. The thyristor accordingly achieves essential immunity from di/dt turn-on failure without the need for external circuitry to limit the di/dt value of the thyristor.

While only certain preferred features of the invention have been shown by way of illustration, many modifications and changes will occur to those skilled in the thyristor art. For example, complementary thyristors could be made in which P-conductivity type semiconductor material is substituted for N-conductivity type material, and vice-versa. It is, therefore, to be understood that the appended claims are intended to cover the foregoing and all such modifications and changes as fall within the true spirit and scope of the invention.

What is claimed is:
1. A multistage amplifying thyristor comprising:
 a semiconductor body comprising a first emitter layer, a first base layer atop said first emitter layer, a second base layer atop said first base layer, a first stage emitter layer atop said second base layer, and a second stage emitter layer atop said second base layer spaced from said first stage emitter layer in a direction of turn on sequence by a portion of said second base layer, said first stage emitter layer having a first edge at its edge toward said second stage emitter layer;
 a first emitter electrode underlying said first emitter layer and in ohmic contact therewith;
 a first stage emitter electrode in a first part overlying said first stage emitter layer and in a second part, situated toward said second stage emitter layer from said first part and in ohmic contact with said second base layer, said first stage emitter electrode having a first edge on its side toward said second stage emitter layer;
 a second stage emitter electrode in ohmic contact with said second stage emitter layer, said second stage emitter layer having a first edge on its side toward said first emitter layer;
 a current control resistor region constituting a portion of said second base region defined on a first side by a projection of said first edge of said first stage emitter electrode onto said second base and on a second side by a projection of said first edge of said second stage emitter layer onto said second base region;
 said current control resistor region having an unmodulated resistance selected to limit to a safe level the turn-on current in each preceding amplifying thyristor stage and having a resistance value $R_G$ of:

$$R_G \geq 0.5 V_G^2 \Delta t_G / C_h \gamma_G (\Delta T_{MAX})$$

wherein $V_G$ is the maximum rated voltage of the device, $\Delta t_G$ is the time during which turn-on current flows through the resistor, $C_h$ is the specific thermal capacity of the semiconductor, $\gamma_G$ is the volume of the semiconductor in which the turn-on current for this resistor flows and $\Delta T_{MAX}$ is the maximum permissible temperature rise in this turn-on volume of the semiconductor;
 said first edge of said first stage emitter electrode extending beyond said first edge of said first stage emitter layer toward second stage emitter layer by a predetermined distance of at least the greater of either one thickness of said semiconductor body or two ambipolar diffusion lengths in said first base layer from at least one of:

an edge of said first stage emitter layer which is on the side of said first stage emitter layer which is away from said second stage emitter layer;
a first edge of the location occupied by the turn-on plasma beneath said first stage emitter layer during device turn-on, where said first edge of said turn-on plasma is toward said second stage emitter layer; and
said first edge of said first stage emitter layer.

2. The invention of claim 1 wherein said predetermined distance comprises at least the greater of either two thickness of said semiconductor body or two ambipolar diffusion lengths of said first base region.

3. The invention of claim 1 wherein said predetermined distance comprises at least the greater of either two thicknesses of said semiconductor body or three ambipolar diffusion lengths in said first base region.

4. The invention of claim 1 wherein said predetermined distance comprises at least the greater of either three thicknesses of said semiconductor body or two ambipolar diffusion lengths in said first base region.

5. The invention of claim 1 wherein said predetermined distance comprises at least the greater of either three thicknesses of said semiconductor body or three ambipolar diffusion lengths in said first base region.

6. The invention of claim 1 wherein said first edge of said first stage emitter electrode extends beyond said first edge of said first stage emitter layer by said predetermined distance from at least one of:
said first edge of said location of said turn-on plasma beneath said first stage emitter layer, and
said first edge of said first stage emitter layer.

7. The invention of claim 1 wherein said first edge of said first stage emitter electrode extends beyond said first edge of said first stage emitter layer by said predetermined distance.

8. The invention of claim 1 wherein said current control resistor region comprises a first zone and a second zone, said second zone having a higher effective resistance than the effective resistance of said first zone.

9. The invention of claim 8 wherein said second zone of said current control resistor region is thinner than said first zone of said current control resistor region.

10. The multistage amplifying thyristor of claim 1 wherein said current control resistor has its second edge spaced from said first edge of said second stage emitter layer and does not underlie said second emitter layer.

11. The multistage amplifying thyristor of claim 10 wherein said second edge of said resistor is spaced from said first edge of said second stage emitter layer by two ambipolar diffusion lengths.

12. The multistage amplifying thyristor of claim 1 further including an additional electrode disposed between said first stage emitter electrode and said second stage emitter layer in ohmic contact with said second base layer and having a first edge on its side toward said first stage emitter electrode and a second edge spaced from said first edge of said second stage emitter layer, said first edge of said additional electrode defining said second side of said current control resistor region.

13. The multistage amplifying thyristor of claim 12 wherein said thyristor is a 4.5 kilovolt light triggered thyristor and said first edge of said first stage emitter electrode is spaced from said first edge of said additional electrode by a distance of approximately 55 mils.

14. The multistage amplifying thyristor of claim 12 wherein said second edge of said current control resistor region is spaced from said first edge of said second stage emitter electrode by two ambipolar diffusion lengths.

15. The multistage amplifying thyristor of claim 14 wherein said first edge of said current control resistor is spaced from and not underlying said first edge of said first stage emitter electrode.

16. The multistage amplifying thyristor of claim 1 wherein said current control resistor exhibits a resistance R when said thyristor is not on and under steady state operating conditions said unmodulated resistor exhibits an effective resistance greater than 80% R.

17. The multistage amplifying thyristor of claim 1 wherein a thickness of the semiconductor body is approximately 30 mils.

18. The multistage amplifying thyristor of claim 1 wherein an ambipolar diffusion length in said second base is approximately 10 mils.

19. The multistage amplifying thyristor of claim 1 wherein said first edge of said first stage emitter electrode is spaced from said first edge of said second stage emitter layer by more than either one thickness of said semiconductor body or two ambipolar diffusion lengths.

20. The multistage amplifying thyristor of claim 1 wherein said first edge of said first stage emitter electrode is spaced from said first edge of said second stage emitter by more than either two thicknesses of said semiconductor body or four ambipolar diffusion lengths.

21. A multistage amplifying thyristor comprising:
a gate stage;
a pilot stage;
a current control structure coupling said gate stage to said pilot stage for limiting the current through said gate stage to a safe current level, said current control structure and having a resistance value $R_G$ of:

$$R_G \geq 0.5 V_G^2 \Delta t_G / C_h \gamma_G (\Delta T_{MAX})$$

wherein $V_G$ is the maximum rated voltage of the device, $\Delta t_G$ is the time during which turn-on current flows through the resistor, $C_h$ is the specific thermal capacity of the semiconductor, $\gamma_G$ is the volume of the semiconductor in which the turn-on current for this resistor flows and $\Delta T_{MAX}$ is the maximum permissible temperature rise in this turn-on volume of the semiconductor.

22. The multistage amplifying gate thyristor of claim 21 wherein said current control structure structure includes a conductive means disposed proximate said pilot stage for coupling current to said pilot stage in a uniform density about the perimeter of the pilot stage which is toward said gate stage.

* * * * *